United States Patent
Joish

(10) Patent No.: US 9,294,116 B2
(45) Date of Patent: Mar. 22, 2016

(54) DIGITAL TO ANALOG CONVERTER DISCHARGE CIRCUIT AND ASSOCIATED METHOD FOR ANALOG TO DIGITAL CONVERTER CIRCUITS

(71) Applicant: TEXAS INSTRUMENTS INCORPORATED, Dallas, TX (US)

(72) Inventor: Rajendrakumar Joish, Karnataka (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/643,528

(22) Filed: Mar. 10, 2015

(65) Prior Publication Data
US 2015/0263757 A1    Sep. 17, 2015

(30) Foreign Application Priority Data
Mar. 11, 2014  (IN) .............. 1250/CHE/2014

(51) Int. Cl.
H03M 1/44  (2006.01)
H03M 1/14  (2006.01)
H03M 1/66  (2006.01)
H03M 1/12  (2006.01)

(52) U.S. Cl.
CPC .............. *H03M 1/442* (2013.01); *H03M 1/12* (2013.01); *H03M 1/145* (2013.01); *H03M 1/66* (2013.01)

(58) Field of Classification Search
CPC ....... H03M 1/145; H03M 1/16; H03M 1/164; H03M 1/442; H03M 1/447
See application file for complete search history.

(56) References Cited

U.S. PATENT DOCUMENTS

| | | | | |
|---|---|---|---|---|
| 6,977,606 B2* | 12/2005 | Daito | .................. | H03M 1/0695 341/161 |
| 7,221,191 B2* | 5/2007 | Ali | ...................... | G11C 27/026 327/94 |
| 7,728,752 B2* | 6/2010 | Ali | ...................... | H03M 1/0863 341/118 |
| 7,821,433 B2* | 10/2010 | Abe | .................... | H03M 1/0604 341/118 |
| 2015/0280727 A1* | 10/2015 | Lien | ................... | H03M 1/1215 341/118 |

* cited by examiner

*Primary Examiner* — Howard Williams
(74) *Attorney, Agent, or Firm* — Gregory J. Albin; Frank D. Cimino

(57) ABSTRACT

A circuit includes an amplifier circuit that receives a residue voltage from an output capacitor connected to an output of a digital to analog converter (DAC). The DAC is employed in a pipeline stage of an analog to digital converter (ADC). The amplifier circuit provides a scaled output voltage based on the residue voltage. A sample circuit samples the scaled output voltage during a first portion of a hold phase of the DAC. A discharge circuit supplies the sampled scaled output voltage to the output of the DAC during a second portion of the hold phase of the DAC to mitigate settling time of the DAC.

20 Claims, 3 Drawing Sheets

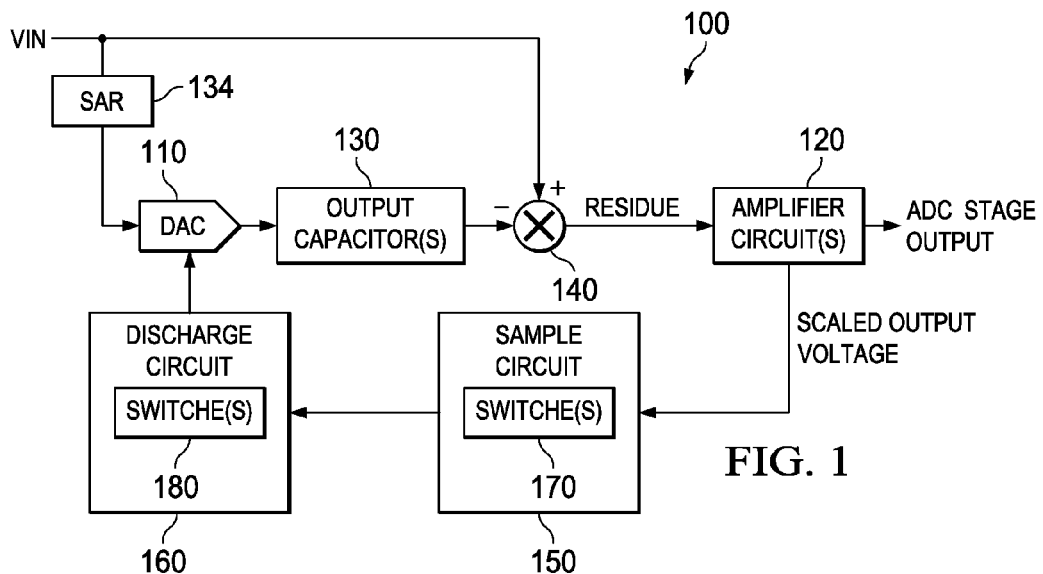
FIG. 1
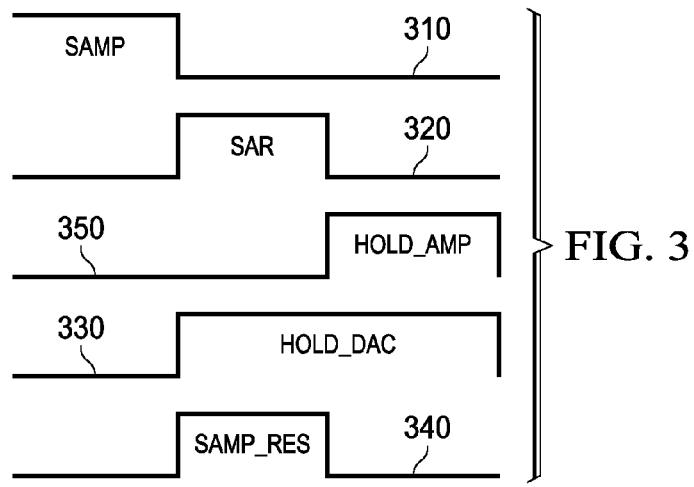
FIG. 3
| TIME | Cs VOLTAGE | Cc VOLTAGE |
|---|---|---|
| END OF SAMP_RES | DAC + $\alpha$*Vres | -$\alpha$*Vres*Gpre*Gpre2 |
| END OF HOLD_AMP | DAC | 0 |
FIG. 4

DIGITAL TO ANALOG CONVERTER DISCHARGE CIRCUIT AND ASSOCIATED METHOD FOR ANALOG TO DIGITAL CONVERTER CIRCUITS

CROSS-REFERENCE TO RELATED APPLICATION

This application claims priority under 35 U.S.C. 119 to India Patent Application 1250/CHE/2014 filed on Mar. 11, 2014, and entitled IMPROVED CURRENT DAC SETTLING IN SWITCHED CAPACITOR CIRCUITS, the entirety of which is incorporated by reference herein.

TECHNICAL FIELD

This disclosure relates to a digital to analog converter discharge circuit for switched capacitor analog to digital converter circuits.

BACKGROUND

Pipelined analog-to-digital converters (ADC's) have become popular ADC architectures for sampling rates from a few mega-samples per second (MSPS) to over one hundred MSPS. Resolutions typically range from eight bits at the faster sample rates up to 16 bits at the lower rates. A pipelined ADC uses two or more steps of subranging, where each stage is responsible for quantizing a number of bits and generating an amplified residue. For example, sample-and-hold samples and holds steady an analog input (VIN), while an ADC in a first stage coarsely quantizes it to a predetermined number of bits. When a given stage finishes processing a sample, determining the bits, and passing the residue to the next stage, it can then start processing the next sample received from the sample-and-hold embedded within each stage. This pipelining action is one reason for the high throughput of the ADC.

In high speed, switched capacitor based ADCs with a current DAC reference in each stage of the pipeline, for example, DAC settling (e.g., time for DAC output to stabilize after DAC input code changed) is expected to be much faster than residue amplifier settling in order to generate an accurate residue in the given hold time for the ADC. However, due to large capacitive loads that DAC reference has to drive, it becomes necessary to consume a lot of power to provide faster DAC settling and overcome the capacitive load. This results in increasing the sizes of DAC switches, DAC current sources, and the power used in the DAC driver circuit.

SUMMARY

This disclosure relates to a pipelined analog to digital converter (ADC) that employs a sample and discharge circuit for a digital to analog converter (DAC) reference in the ADC to mitigate settling time of the DAC.

In one example, a circuit includes an amplifier circuit that receives a residue voltage from an output capacitor connected to an output of a digital to analog converter (DAC). The DAC is employed in a pipeline stage of an analog to digital converter (ADC). The amplifier circuit provides a scaled output voltage based on the residue voltage. A sample circuit samples the scaled output voltage during a first portion of a hold phase of the DAC. A discharge circuit supplies the sampled scaled output voltage to the output of the DAC during a second portion of the hold phase of the DAC to mitigate settling time of the DAC.

In another example, a circuit includes a preamplifier having an input that receives a residue input voltage from an output capacitor connected to an output of a digital to analog converter (DAC). The preamplifier has an output to generate an amplified output of the residue input voltage. A sense amplifier has an input that receives the amplified output from the preamplifier and has an output that provides a scaled output voltage based on the received amplified output from the preamplifier. A sample circuit has an input switch that switches the scaled output voltage from the sense amplifier on to a sampling capacitor during a first portion of a hold phase of the DAC. A discharge circuit employs at least one switch to supply the switched scaled output voltage from the sampling capacitor to the output of the DAC during a second portion of the hold phase of the DAC to mitigate settling time of the DAC.

In yet another example, a method includes amplifying a residue input voltage from an output capacitor connected to an output of a digital to analog converter (DAC) to generate an amplified output of the residue input voltage. The method includes scaling the amplified output of the residue input voltage to generate a scaled output voltage. The method includes sampling the scaled output voltage during a first portion of a hold phase of the DAC. This includes switching the scaled output voltage to the output of the DAC during a second portion of the hold phase of the DAC to mitigate settling time of the DAC.

BRIEF DESCRIPTION OF THE DRAWINGS

FIG. 1 illustrates an example block diagram of a single stage of a pipelined analog to digital converter (ADC) that employs a sample and discharge circuit for a digital to analog converter (DAC) reference in the ADC to mitigate settling time of the DAC.

FIG. 3 illustrates an example timing diagram a single stage of the example pipelined ADC depicted in FIG. 2.

FIG. 4 illustrates an example table illustrating voltages generated with respect to the timing diagram of FIG. 3.

DETAILED DESCRIPTION

Figure 2:
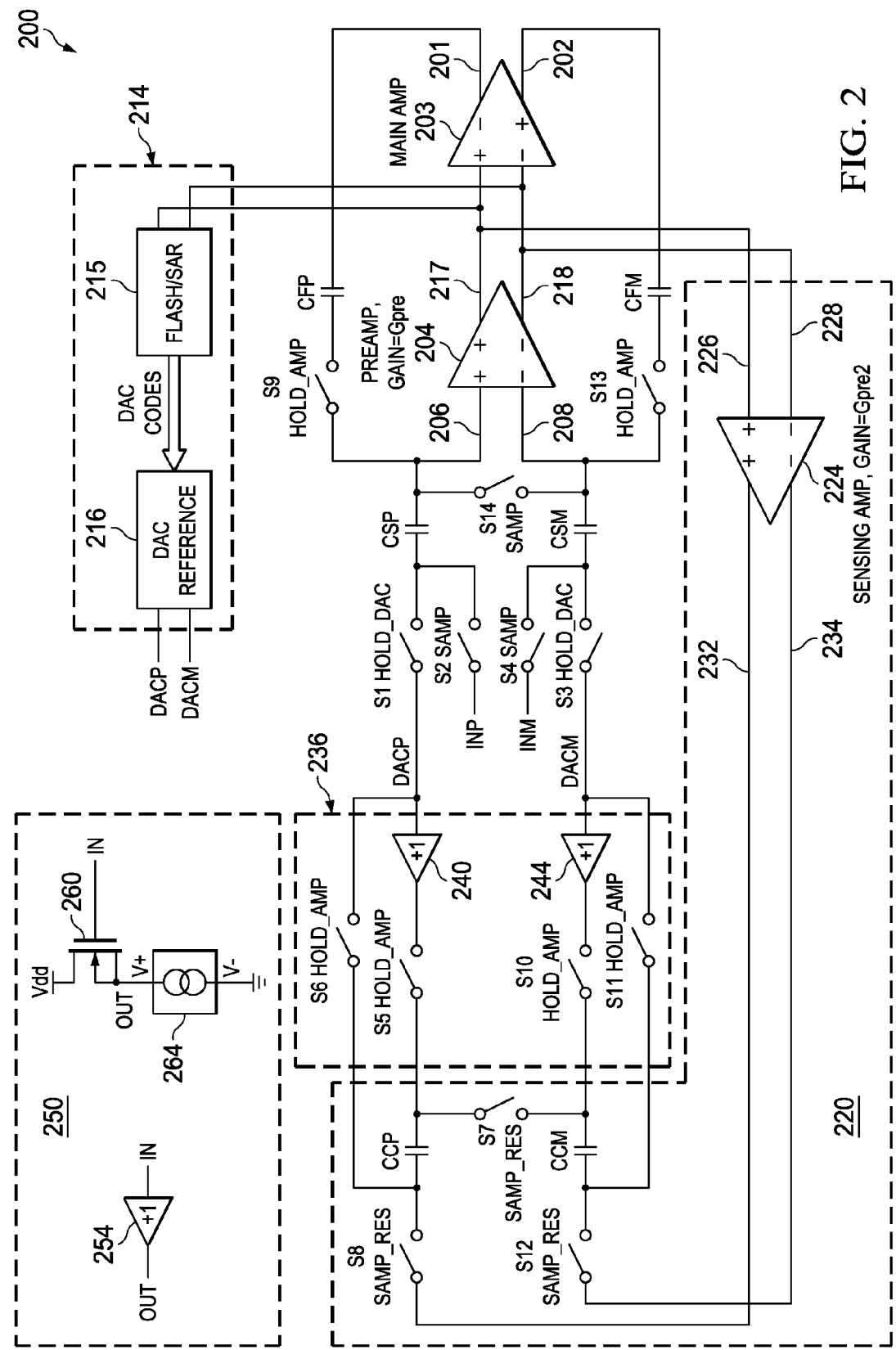
FIG. 2 illustrates an example implementation of a single stage of a pipelined ADC that employs a sample and discharge circuit for a DAC reference in the ADC to mitigate settling time of the DAC.

This disclosure relates to a pipelined analog to digital converter (ADC) that employs a sample and discharge circuit for a digital to analog converter (DAC) reference in the ADC to mitigate settling time of the DAC.

By way example, in typical ADC converter stages, a reference DAC along with associated switching and amplifier circuitry are employed in the ADC to facilitate conversion of an analog input voltage to a digital value. The capacitance at the output of the DAC typically requires that the reference DAC and associated power/switching circuits provide increased power capability in order to overcome the capacitance and allow the DAC to settle in time before the analog conversion of the stage can commence.

The pipelined ADC, as disclosed, herein utilizes a sample and discharge circuit to both sample the voltage of the DAC output capacitance and to discharge the sampled voltage from the output capacitance during a hold phase when the DAC output is employed as a reference voltage in the ADC (e.g., reference voltage converted to a residue voltage in the ADC).

As a result, power and settling time of the pipelined ADC disclosed herein can be reduced compared to typical existing designs. For example, by sampling and discharging the DAC output capacitance voltage in this manner, DAC settling time can be reduced which allows power in the ADC stage to be reduced by at least a factor of five times with respect to the additional power utilized by conventional designs to achieve comparable settling performance (e.g., about an order of magnitude or greater power reduction for DAC and associated circuitry).

FIG. 1 illustrates an example block diagram of a single stage of a pipelined analog to digital converter (ADC) circuit 100 that employs a sample and discharge circuit for a digital to analog converter (DAC) reference 110 in the ADC to mitigate settling time of the DAC. As used herein, the term circuit can include a collection of active and/or passive elements that perform a circuit function such as an analog circuit or control circuit, for example. The term circuit can also include an integrated circuit where all the circuit elements are fabricated on a common substrate, for example.

The circuit 100 includes an amplifier circuit 120, which can include multiple amplifiers, receives a residue voltage from an output capacitor 130 (or capacitors) connected to an output of the DAC 110. The DAC 110 is employed to provide a reference voltage in a pipeline stage of the ADC circuit 100. The DAC 110 can also operate in conjunction with a successive approximation register (SAR) 134 to facilitate conversion of input voltage VIN to an analog output from the DAC. Although, a single stage is illustrated by the example circuit 100, a plurality of such stages can be connected together to perform an overall analog to digital conversion of the input voltage VIN. As shown, VIN is fed to the DAC 110 and to a summing node 140 which generates the residue voltage supplied to the amplifier circuit 120. In some examples, the summing node 140 can be incorporated as part of the amplifier circuit 120 (e.g., inputs to a preamplifier) as opposed to being a separate component as shown in this example.

In addition to providing an ADC stage output voltage to be utilized for analog conversion for the next stage of the ADC pipeline, the amplifier circuit 120 can also include a sensing amplifier (See e.g., FIG. 2) to provide a scaled output voltage based on the residue voltage received at its input. A sample circuit 150 samples the scaled output voltage during a first portion of a hold phase of the DAC. As used herein, the hold phase for the DAC (e.g., HOLD_DAC) refers to a time that the DAC output is commanded to a substantially constant value. Another hold phase for the circuit 100 is referred to as a hold amplifier phase (e.g., HOLD_AMP) which refers to the time that the ADC stage output from the amplifier circuit 120 is held for conversion in the next stage of the ADC pipeline. Such hold phases along with other ADC conversion phases will be illustrated and described below with respect to FIG. 3.

A discharge circuit 160 supplies the sampled scaled output voltage to the output of the DAC 110 during a second portion of the hold phase of the DAC to mitigate settling time of the DAC. As will be illustrated and described below with respect to FIG. 2, the discharge circuit 160 can include one or more buffer amplifiers to enable discharging the output capacitor 130 via the discharge circuit 160. The circuit 100 can be implemented as a single ended stage or as a differential stage. In the example of a single ended stage, a single output capacitor 130 is employed along with a single buffer amplifier to discharge the capacitor. In a differential stage, such as illustrated with respect to the example circuit of FIG. 2, multiple output capacitors and buffers can be employed to discharge the capacitors.

The amplifier circuit 120 can include one or more amplifier stages, including a preamplifier and a sense amplifier, where some of the stages may be employed for residue/main amplification and/or other stages employed for sensing (See e.g., FIG. 2). The preamplifier includes an input that receives the residue input voltage from the output capacitor 130 which is connected to an output of a DAC 110. The preamplifier in the amplifier circuit 120 has an output to generate an amplified output of the residue input voltage. The sense amplifier in the amplifier circuit 120 has an input that receives the amplified output from the preamplifier and has an output that provides the scaled output voltage from the amplifier circuit based on the received amplified output from the preamplifier. The sample circuit 150 includes an input switch 170 (or switches) (See, e.g., FIG. 2) that is selectively activated to connect the scaled output voltage from the sense amplifier on to a sampling capacitor during a first portion of a hold phase of the DAC 110. The discharge circuit 160 employs at least one controllable switch 180 (or switches) that electrically connects the switched scaled output voltage from the sampling capacitor to the DAC 110. For example, the controllable switches of the discharge circuit 160 are controlled to supply the switched scaled output voltage from the sampling capacitor to the output of the DAC 110 during a second portion of the hold phase of the DAC to mitigate settling time of the DAC. By discharging the output capacitor 130 in this manner during various hold phases of the pipelined ADC circuit 100, overall power consumption by the circuit 100 can be reduced. Settling time can also be mitigated.

FIG. 2 illustrates an example implementation of a single stage of a pipelined analog to digital converter (ADC) circuit 200 that employs a sample and discharge circuit for a digital to analog converter reference in the ADC to mitigate settling time of the DAC. The example circuit 200 is a differential circuit that receives a differential signal at respective inputs INP and INM and provides a differential output at respective outputs 201 and 202 of a main residue amplifier 203. The circuit 200 includes a preamplifier 204 having a differential input 206 and 208 that receives a residue input voltage from output capacitors CSP and CSM which are connected to outputs DACP and DACM of a digital to analog converter (DAC) 214 via switches S1 and S3 in response to switch control signals HOLD_DAC. The output capacitors CSP and CSM also receive the input voltage switches S2 and S4 are activated via a signal SAMP and S1/S3 are deactivated via HOLD_DAC. Switch S14 is also operative with switches S2 and S3 to sample INP and INM via the SAMP signal. The DAC 214 includes a flash/SAR block 215 to generate DAC codes for DAC reference 216 which provides DAC output signals DACP and DACM . . . .

The preamplifier 204 includes a differential output 217 and 218 and is configured with a gain (Gpre) to generate an amplified output of the residue input voltage. In this example, the preamplifier 204 performs the summing node function described above with respect to FIG. 1. For example, the preamplifier 204 sums DAC outputs DACP and DACM with input voltage INP and INM that is switched into capacitors CSP and CSM. The preamplifier 204 receives feedback from the main amplifier 203 via capacitors CFP and CFM and switches S9 and S13 which are controlled via a hold amplifier signal HOLD_AMP.

A sample circuit 220 includes a sense amplifier 224 that has an input 226 and 228 and receives the amplified output 217 and 218 from the preamplifier 204. The sense amplifier 224 has an output 232 and 234 that provides a scaled output voltage based on the received amplified output from the preamplifier 204. The sample circuit 220 includes input switches S7, S8, and S12 that respond to respective switch control signal SAMP_RES. For example, the switches S7, S8, and S12 are selectively activated to switch the scaled output voltage 232 and 234 from the sense amplifier 224 on to sampling capacitors CCP and CCM during a first portion of a hold phase of the DAC 214.

A discharge circuit 236 having switches S5, S6, S7, and S10 operates in response to a HOLD_AMP signal and in conjunction with buffers 240 and 244 (e.g., transistor switch device source followers having gain of 1) to supply the switched scaled output voltage from the sampling capacitors CCP and CCM to the DAC output DACP and DACM of the DAC 214 during a second portion of the hold phase of the DAC to mitigate settling time of the DAC. The HOLD_AMP switches S5, S6, S7, and S10 allow the sampled charge of CCP and CCM to be placed onto capacitors CSP and CSM during the hold phase of the DAC and ADC pipeline to mitigate the effects of the charge on CSP and CSM which has the overall effect of reducing the settling time of the DAC 214. By using this sampling and discharging circuit, overall additional current in the circuit 200 (to meet a given DAC settling time) can be reduced from about 3 mA to about 600 uA over existing circuit designs, when CCP and CCM equal about 100 femto-farads with CSM and CSM being about 1/10 of CCP and CCM. Also, the gain of the preamplifier 204 can be set to about the same gain as the sense amplifier 224, where each gain Gpre1 and Gpre2 can be set to about 3.1. An example of the buffers 240 and 244 is shown at 250. For example, a buffer 254 can be implemented as source follower 260 driven by current source 264.

FIG. 3 illustrates an example timing diagram of a single stage of a pipelined analog to digital converter (ADC) circuit 200 depicted in FIG. 2. Top waveforms 310 and 320 represent normal timing conversion windows SAMPLE and SAR (Successive Approximation Register) for a pipelined ADC stage. The SAR time is the time where input is quantized and digital control signals for the DAC are generated. The DAC voltage is set based on these control signals in this time. At 330, a HOLD_DAC signal phase illustrated where the output of the DAC 214 is connected via switches S1 and S3 in response to a HOLD_DAC signal shown at 330. During a first portion of the HOLD_DAC phase 330, residue is sampled via waveform SAMP_RES 340 which controls switches S7, S8, and S12. During a second portion of the HOLD_DAC phase 330, a HOLD_AMP 350 signal is issued (e.g., via a controller or control circuit) which activates HOLD_AMP switches S5, S6, S7, S9, S10, S11, and S13 and provides sampled charge on capacitors CCP and CCM to DAC output DACP and DACM.

In the amplifier hold phase at 350, the DAC 214 provides a charge, Qdac=α*(DAC−INPUT)*Cs=−α*Vres*Cs, where Vres=residue voltage given by Vres=INPUT−DAC). The term α is the attenuation factor given by (Cs)/(Cs+Cp) where Cs=sampling capacitor value and Cp=total parasitic capacitor on preamplifier input. For example, if no parasitic (i.e., Cp=0), then α=1. Qdac=total differential charge to be delivered by DAC reference onto CSP and CSM in amplifier Hold Phase. If this charge can be dumped on CSM and CSP by another path (and not the DAC), it can improve DAC settling. This can be achieved as follows: At the end of SAR time, differential voltage at input of preamplifier 204 is given by Vvgnd=(−α*Vres), where preamplifier output 217 and 218 are represented as Vpre=(−α*Vres*Gpre). Since the Vres voltage is available before amplifier hold starts, a scaled up version of Vres can be sampled on capacitors CCP and CCM and dumped/discharged during the HOLD_AMP phase on CSP and CSM.

The scaled version of Vres i.e., (−Gpre*Gpre2*α*Vres) can be sampled on capacitors CCP and CCM at the end of SAMP_RES 340 as shown in the diagram of FIG. 3, where Gpre=preamplifier gain and Gpre2=sense amplifier gain. When HOLD_AMP at 350 begins, CCP and CCM are connected across actual DAC nodes (DACP, DACM) and their buffered versions (i.e., outputs of buffer amplifiers) The charge transferred by CCP and CCM on to the DAC output nodes DACP and DACM can be represented as Qcc=−α*Gpre*Gpre2*CC. If CCP and CCM is chosen as, Cc=Cs/(Gpre*Gpre2), then Qcc=Qdac. In one example, the sense amplifier 224 can be a scaled down replica of the preamplifier 204. In this example, discharge circuit buffering can be implemented using source followers as the buffer amplifiers 240 and 244 as shown.

FIG. 4 illustrates an example table illustrating voltages generated with respect to the timing diagram of FIG. 3. At the end of SAMP_RES 340, CSP and CSM voltage equals DAC output+α*Vres as shown at 410. The voltage on CCP and CCM (−Gpre*Gpre2*α*Vres) at the end of SAMP_RES 350 as shown at 420. At the end of the HOLD_AMP time 350, CSP and CSM voltage is equal to the DAC output voltage shown at 430 and CCP and CCM voltage is about equal to zero as shown at 440.

Figure 5:
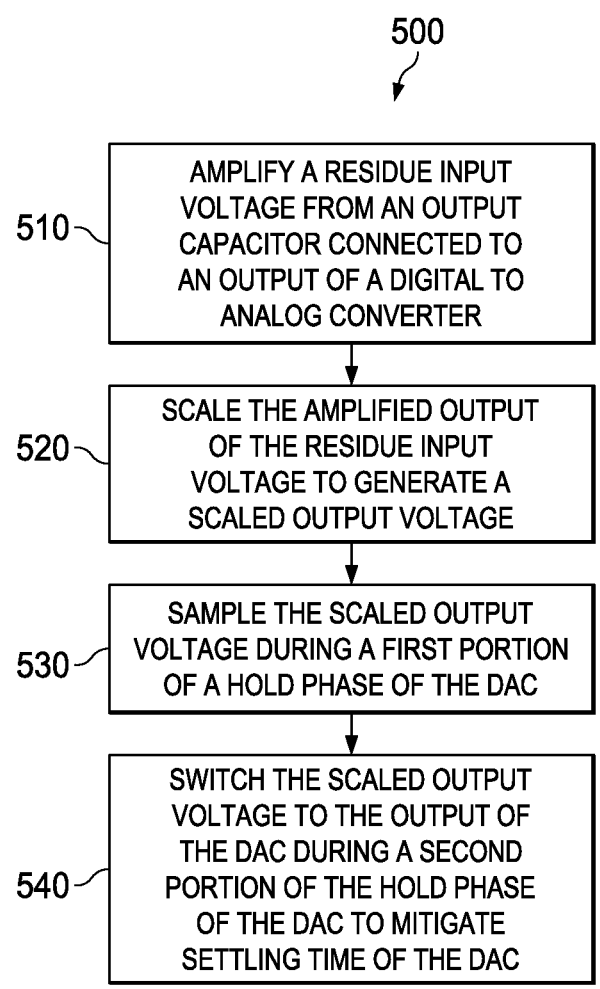
FIG. 5 illustrates an example method to mitigate settling time of a reference DAC in a pipelined ADC stage.

In view of the foregoing structural and functional features described above, an example method will be better appreciated with reference to FIG. 5. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured in an IC or a controller, for example.

FIG. 5 illustrates an example method 500 to mitigate settling time of a reference digital to analog converter (DAC) in a pipelined analog to digital converter (ADC) stage. The method 500 includes amplifying a residue input voltage from an output capacitor connected to an output of a digital to analog converter (DAC) to generate an amplified output of the residue input voltage (e.g., via preamplifier 204 of FIG. 2). The method 500 includes scaling the amplified output of the residue input voltage to generate a scaled output voltage (e.g., via sense amplifier 224 of FIG. 2). The method 500 includes sampling the scaled output voltage during a first portion of a hold phase of the DAC (e.g., via switches SW1-SW3 of FIG. 2). The method 500 includes switching the scaled output voltage to the output of the DAC during a second portion of the hold phase of the DAC to mitigate settling time of the DAC (e.g., via switches SW6-SW9 of FIG. 2).

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
an amplifier circuit that receives a residue voltage from an output capacitor connected to an output of a digital to analog converter (DAC), the DAC being employed in a pipeline stage of an analog to digital converter (ADC), the amplifier circuit providing a scaled output voltage based on the residue voltage;
a sample circuit that samples the scaled output voltage during a first portion of a hold phase of the DAC; and
a discharge circuit that supplies the sampled scaled output voltage to the output of the DAC during a second portion of the hold phase of the DAC to mitigate settling time of the DAC.

2. The circuit of claim 1, wherein the sample circuit further comprises controllable switches that sample the scaled output voltage during the first portion of the hold phase of the DAC.

3. The circuit of claim 2, wherein the sample circuit further comprises sampling capacitors that store the sampled scaled output voltage during the first portion of the hold phase of the DAC.

4. The circuit of claim 3, wherein the sampling capacitors are configured at about ten times a capacitance of the output capacitor.

5. The circuit of claim 3, the discharge circuit includes switches to supply the sampled scaled output voltage from the sampling capacitors to the output capacitor connected to the output of the DAC during the second portion of the hold phase of the DAC and during a hold amplifier phase of the ADC which holds the residue voltage for a subsequent stage of the ADC.

6. The circuit of claim 5, wherein the discharge circuit further comprises at least one buffer to enable the discharge of the sampling capacitors on to the output capacitor connected to output of the DAC.

7. The circuit of claim 1, wherein the amplifier circuit includes a preamplifier having an input that receives the residue voltage from the output capacitor, the preamplifier including an output to generate an amplified output of the residue voltage.

8. The circuit of claim 7, wherein the amplifier circuit includes a sense amplifier having an input that receives the amplified output from the preamplifier and having an output that provides a scaled output voltage based on the received amplified output from the preamplifier.

9. The circuit of claim 8, wherein the sense amplifier has a gain that is set to a similar gain as the preamplifier to provide the scaled output voltage.

10. A circuit comprising:
a preamplifier having an input that receives a residue input voltage from an output capacitor connected to an output of a digital to analog converter (DAC), the preamplifier having an output to generate an amplified output of the residue input voltage;
a sense amplifier having an input that receives the amplified output from the preamplifier and having an output that provides a scaled output voltage based on the received amplified output from the preamplifier;
a sample circuit that switches the scaled output voltage from the sense amplifier on to a sampling capacitor during a first portion of a hold phase of the DAC; and
a discharge circuit that employs at least one switch to supply the switched scaled output voltage from the sampling capacitor to the output of the DAC during a second portion of the hold phase of the DAC to mitigate settling time of the DAC.

11. The circuit of claim 10, the sample circuit includes controllable switches that sample the scaled output voltage during the first portion of the hold phase of the DAC.

12. The circuit of claim 11, wherein the sampling capacitor is configured at about ten times a capacitance of the output capacitor.

13. The circuit of claim 12, the at least one switch of the discharge circuit supplies the sampled scaled output voltage from the sampling capacitors on to the output capacitor connected to the output of the DAC during the second portion of the hold phase of the DAC and during a hold amplifier phase for the ADC which holds residue voltage for a subsequent stage of the ADC.

14. The circuit of claim 10, wherein the DAC is a current source reference DAC that converts a successive approximation register (SAR) value to a current source output.

15. The circuit of claim 14, wherein the discharge circuit further comprises at least one buffer amplifier to enable the discharge of the sampling capacitors on to the output capacitor connected to output of the DAC.

16. The circuit of claim 15, where the at least one buffer amplifier comprises a source follower transistor switch device.

17. The circuit of claim 15, wherein the sense amplifier has a gain that is set to a similar gain as the preamplifier to provide the scaled output voltage.

18. A method comprising:
amplifying a residue input voltage from an output capacitor connected to an output of a digital to analog converter (DAC) to generate an amplified output of the residue input voltage;
scaling the amplified output of the residue input voltage to generate a scaled output voltage;
sampling, via a controller, the scaled output voltage during a first portion of a hold phase of the DAC; and
switching, via the controller, the scaled output voltage to the output of the DAC during a second portion of the hold phase of the DAC to mitigate settling time of the DAC.

19. The method of claim 18, further comprising buffering the scaled output voltage to enable discharge of the sampled scaled output voltage on to the output capacitor connected to the output of the DAC.

20. The circuit of claim 18, further comprising switching the scaled output voltage to the output of the DAC during the second portion of the hold phase of the DAC and during a hold amplifier phase of the ADC which holds residue voltage for a subsequent stage of the ADC.

* * * * *